(12) United States Patent
Schwarzkopf

(10) Patent No.: US 10,263,546 B2
(45) Date of Patent: Apr. 16, 2019

(54) METHOD FOR DETERMINING A MULTIPHASE MOTOR CURRENT AND ELECTRIC MOTOR DRIVE

(71) Applicant: Brose Fahrzeugteile GmbH & Co. Kommanditgesellschaft, Wuerzburg, Wuerzburg (DE)

(72) Inventor: Johannes Schwarzkopf, Marktheidenfeld (DE)

(73) Assignee: Brose Fahrzeugteile GmbH & Co. Kommanditgesellschaft, Wuerzburg, Wuerzburg (DE)

( * ) Notice: Subject to any disclaimer, the term of this patent is extended or adjusted under 35 U.S.C. 154(b) by 0 days.

(21) Appl. No.: 15/810,687

(22) Filed: Nov. 13, 2017

(65) Prior Publication Data

US 2018/0138843 A1    May 17, 2018

(30) Foreign Application Priority Data

Nov. 11, 2016 (DE) .................. 10 2016 222 214

(51) Int. Cl.
*H02P 6/185* (2016.01)
*H02P 6/28* (2016.01)
(Continued)

(52) U.S. Cl.
CPC ............ *H02P 6/185* (2013.01); *B60R 16/03* (2013.01); *G01R 15/18* (2013.01);
(Continued)

(58) Field of Classification Search
CPC .. H02P 27/06; H02P 6/28; H02P 21/22; H02P 27/085; H02P 6/085; H02P 25/022; H02P 6/185
See application file for complete search history.

(56) References Cited

U.S. PATENT DOCUMENTS 5,789,934 A * 8/1998 Kolkowski ........ G01R 19/0092
324/537
6,452,405 B1    9/2002 Collier-Hallman
(Continued)

FOREIGN PATENT DOCUMENTS

DE         197 39 322 A1    3/1999
DE    10 2006 006 328 A1    8/2006
(Continued)

*Primary Examiner* — Thai T Dinh
(74) *Attorney, Agent, or Firm* — Muncy, Geissler, Olds & Lowe, P.C.

(57) ABSTRACT

A method for determining a motor current of an electric motor drive with a power source and with an electric motor and with a power converter connected therebetween, wherein an input current of the power source is converted by a pulse width modulated control of a number of semiconductor switches of the power converter into the motor current, wherein an intermediate circuit current of an intermediate circuit of the power source is influenced during the pulse width modulated control of the semiconductor switches, wherein an inductive voltage change is detected at a measuring point of the intermediate circuit due to the influence on the intermediate circuit current, and wherein a value for the generated motor current is determined based on the pulse width modulated control of the semiconductor switches and the inductive voltage change detected at the measuring point.

16 Claims, 4 Drawing Sheets

(51) Int. Cl.
*B60R 16/03* (2006.01)
*G01R 15/18* (2006.01)
*G01R 19/25* (2006.01)
*H02P 27/08* (2006.01)
*H02M 7/5387* (2007.01)
*H02M 1/00* (2006.01)

(52) U.S. Cl.
CPC ............ *G01R 19/2513* (2013.01); *H02P 6/28* (2016.02); *H02P 27/08* (2013.01); *H02M 7/53871* (2013.01); *H02M 2001/0009* (2013.01)

(56) References Cited

U.S. PATENT DOCUMENTS

| | | | | |
|---|---|---|---|---|
| 6,794,854 B2 * | 9/2004 | Nakatsu | ............... | H01C 1/14 322/17 |
| 7,161,323 B2 * | 1/2007 | Ajima | ............... | B62D 5/046 318/560 |
| 7,671,557 B2 * | 3/2010 | Maeda | ............. | H02M 7/53873 318/729 |
| 9,444,377 B2 * | 9/2016 | Sato | ....................... | H02P 1/46 |
| 9,998,061 B2 * | 6/2018 | Shinohara | ............ | H02P 29/027 |
| 2003/0006749 A1 | 1/2003 | Rollman | | |
| 2004/0125622 A1 * | 7/2004 | Hirono | ............. | H02M 7/53873 363/37 |
| 2008/0061728 A1 * | 3/2008 | Tomigashi | ........... | H02M 7/217 318/768 |
| 2010/0019710 A1 | 1/2010 | Schwarzkopf et al. | | |
| 2012/0191250 A1 * | 7/2012 | Iwata | ....................... | B25F 5/00 700/275 |
| 2015/0214869 A1 | 7/2015 | Schwarzkopf | | |
| 2015/0214882 A1 * | 7/2015 | Suzuki | .................. | B62D 5/046 318/139 |

FOREIGN PATENT DOCUMENTS

DE 10 2006 032 491 A1 1/2008
DE 10 2014 000 945 A1 7/2015

* cited by examiner

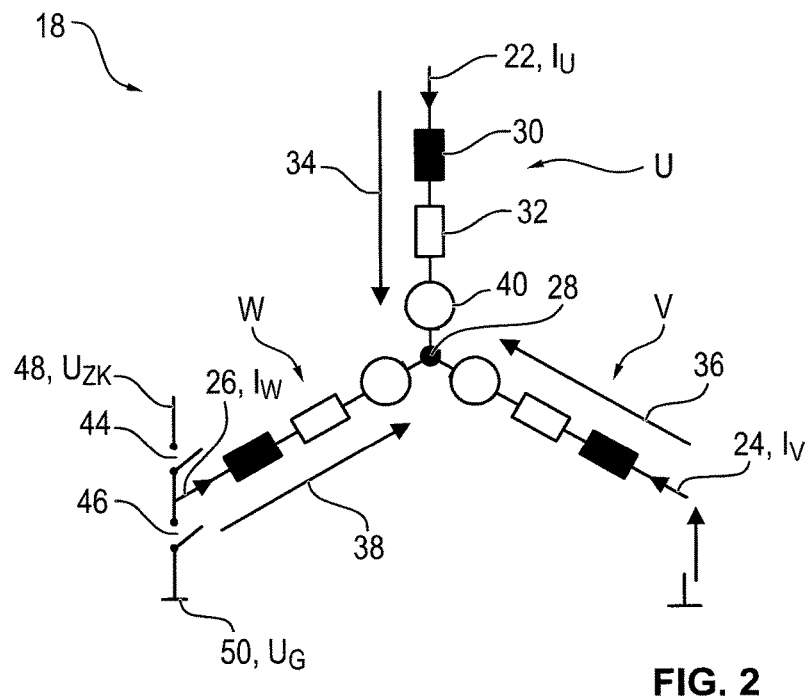
FIG. 2
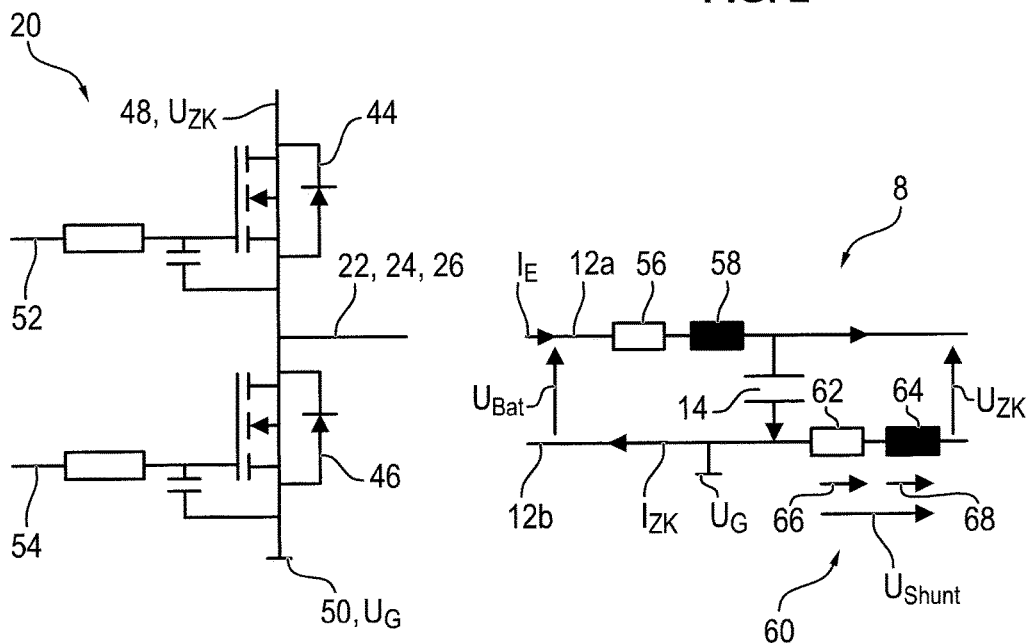
FIG. 3
FIG. 4

METHOD FOR DETERMINING A MULTIPHASE MOTOR CURRENT AND ELECTRIC MOTOR DRIVE

This nonprovisional application claims priority under 35 U.S.C. § 119(a) to German Patent Application No. 10 2016 222 214.7, which was filed in Germany on Nov. 11, 2016, and which is herein incorporated by reference.

BACKGROUND OF THE INVENTION

Field of the Invention

The invention relates to a method for determining a multiphase motor current of an electric motor drive with a power source and with an electric motor and with a power converter connected therebetween. The invention furthermore relates to an electric or electric motor drive suitable for carrying out a method of this kind.

Description of the Background Art

Adjustment systems, driven by electric motors, as motor vehicle components, such as window lifters, seat adjusters, door and sunroof drives, or radiator fan drives and pumps or internal fans typically have an electric or electric motor drive with a controlled electric motor. For example, brushless electric motors are known for this purpose in which a rotor, mounted rotatably relative to a stator, is driven by a rotating magnetic field. To this end, phase windings of the stator are subjected to an appropriate electric three-phase or motor current, which is controlled and regulated by means of a controller as part of the (motor) electronics.

Such electric motor drives usually comprise a (high-voltage) battery as the in-vehicle energy storage system, from which the electric motor is supplied with electrical energy in the form of a direct current. To convert the direct current into the motor current, a power converter (inverter) is suitably connected between the energy storage system and the electric motor. In this case, a (direct voltage) intermediate circuit, to which a bridge circuit of the power converter is connected, is placed downstream of the energy storage system. The energy storage system and the intermediate circuit act here as a power source for providing the input-side direct current (input current) for the power converter. The motor current is generated by a pulse width modulated (PWM) control of semiconductor switches of the bridge circuit as a multiphase output current. The semiconductor switches are switched in a clocked manner between a conducting and a blocking state by the pulses of the PWM control.

A secure detection and determination of the motor current are necessary for reliable operation of the drive or electric motor. A cost-effective method is, for example, the detection of an ohmic voltage change of the electrical current in the intermediate circuit (intermediate circuit current) via an ohmic measuring resistor (shunt) of the intermediate circuit. A respective phase current flows through the measuring resistor depending on the pulse width modulated control of the semiconductor switches or depending on their switching states. The resulting ohmic voltage change can be detected with a measuring circuit. The phase currents or the motor current can be determined on the basis of the detected voltage change and knowledge of the switching states of the semiconductor switches.

For a reliable determination of the motor current, in this case highly accurate and temperature-compensated measuring resistors are needed, which are relatively expensive. At high currents, as they often occur in electric motor drives in motor vehicles, low-impedance shunts are usually used as measuring resistors. Measuring resistors of this kind always have a certain inductance, so that, in addition to the ohmic voltage change, during the pulse width modulated control of the semiconductor switch, an inductive voltage change also occurs at the measuring resistor, which, due to the typically very short switching times of the semiconductor switches, is often many times higher than the ohmic voltage change to be detected. To compensate for this, the measuring circuit typically has a compensation circuit. Due to manufacturing tolerances, it is possible that the compensation circuit reliably compensates the arising inductive voltage drops only after a relatively long settling time. This adversely affects the determination of the phase current or motor current.

SUMMARY OF THE INVENTION

It is therefore an object of the invention to provide a particularly suitable method for determining a multiphase motor current of an electric motor drive. The invention further has the object of providing an electric motor drive suitable for such a method.

The method of the invention is suitable and designed for determining a motor current of an electric motor drive. The electric or electric motor drive in this case has an electric motor, which is supplied with electrical energy by a power source, wherein a converter is provided which is switched between the power source and the electric motor and which during operation converts an electrical input current of the power source into the motor current for operating the electric motor. A motor current is to be understood hereafter as, in particular, a phase current of a single motor phase and/or a multiphase rotary current in one or more motor phases. In other words, the motor current is in particular the output current of the converter, which is preferably designed as an inverter.

To convert the input current of the power source into the motor current, a number of semiconductor switches of the converter are switched in a clocked manner by means of a pulse width modulated control between a conducting and a blocking state. The semiconductor switches are, for example, part of a bridge circuit, which is connected to a (direct voltage) intermediate circuit of the power source. An intermediate circuit current of the intermediate circuit is influenced during this pulse width modulated control of the semiconductor switches.

An inductive voltage change arising due to the influence on the intermediate circuit is detected at a measuring point of the intermediate circuit. A value for the motor current generated by the converter is determined based on the pulse width modulated control of the semiconductor switches and the inductive voltage change detected at the measuring point. In other words, the detected inductive voltage change is evaluated together with the switching state of the semiconductor switches in order to determine a value for the motor current.

In contrast to the prior art, the inductive voltage change is thus evaluated instead of an ohmic voltage change in order to determine the motor current. In other words, the inductive signal typically interpreted as a disruption is used as a useful signal.

The invention is based on the realization that during operation of the electric motor the intermediate circuit current is changed due to the pulse width modulated control of the semiconductor switch, as a result of which a voltage change occurs at the measuring point. The voltage change in this case has both an ohmic and an inductive component, wherein the inductive voltage change during the switching operations is much higher than the ohmic voltage change. This makes it possible to substantially completely neglect the ohmic voltage change when evaluating the inductive voltage change for determining the motor current. This allows a simplified and reliable determination of the motor current.

In an embodiment, the inductive voltage change detected at the measuring point is amplified. This ensures an especially reliable determination of the motor current.

In an embodiment, the inductive voltage change can be integrated at the measuring point. The difference in the integration before and after a switching operation of the semiconductor switches is hereby proportional to the phase current or motor current. As a result, a motor current determination that is easy to implement and operationally reliable is realized, a reliable operation of the electric motor drive being ensured.

In an embodiment, the input current of the power source is detected to determine the motor current. In this case, the circumstance is advantageously used that the average of the intermediate circuit current is substantially proportional to the average of the input current (battery current) of the power source. As a result, the average of the detected inductive voltage change is also proportional to the average of the input current. The input current can thus be used as an additional or redundant measured value for the evaluation, as a result of which an especially reliable determination of the motor current is ensured.

The electric motor drive of the invention is suitable and configured to carry out the above-described method. The electric motor drive in this case is provided in particular for use in a motor vehicle, for example, for an adjustment system as a motor vehicle component. For this purpose, the drive comprises a power source and an electric motor and a power converter connected therebetween. The electric motor is preferably brushless with a stator and with a rotor mounted rotatably therein. The stator has a number of phase windings, which, on one side, are routed to the converter and, on the other, are connected in a star connection, for example, at a common connection point (star point).

The converter has a controller, i.e., a control unit. The controller here is generally suitable and set up for carrying out the above-described method in terms of programming and switching technology. The controller is thus specifically configured to at least monitor the switching states or the pulse width modulated control of the semiconductor switches during operation and to detect the inductive voltage change at the measuring point and to determine therefrom a value for the motor current of the electric motor.

In an embodiment, the controller can be formed at least in the core by a microcontroller with a processor and a data memory in which the functionality for carrying out the method of the invention is implemented by programming in the form of operating software (firmware), so that when the operating software is run in the microcontroller, the method is performed automatically, optionally in interaction with a user.

In an embodiment of the invention, the controller can also be formed by a non-programmable electronic component, for example, an ASIC (application-specific integrated circuit), in which the functionality for carrying out the method is implemented with circuitry.

The electric or electric motor drive operated by the method thus has an improved behavior with respect to a determination of the motor current. Basically, however, the use is not restricted to the automotive sector.

In an embodiment, the measuring point is equipped, for example, with a measuring resistor, in particular a shunt, via which the inductive voltage change is detected by the controller. In an advantageous embodiment, however, the measuring point is designed as a measuring resistor-free trace section of the intermediate circuit. In other words, unlike the prior art for voltage detection, no temperature-compensated resistor is used. This embodiment uses the fact that the method of the invention is based on an inductive effect, which has only a low temperature dependence, in an advantageous and cost-effective manner. This makes it possible to measure or detect the (inductive) voltage change only via or by means of a trace section, a metal sheet, or the like.

In an embodiment, the voltage change is detected on the longest possible trace section of the intermediate circuit, as a result of which the inductive component of the voltage change is increased. Consequently, this advantageously transfers to the signal quality during the detection, as a result of which the evaluation and thus determination of the motor current are improved. Furthermore, thus power losses of the converter and thus of the drive are reduced.

In an embodiment, the controller detects the inductive voltage change, caused by the intermediate circuit current, at the measuring point by means of a measuring circuit with an amplifier, for example, an operational amplifier or an analog-to-digital converter (ADC). In this case, in a preferred embodiment, the amplifier is connected in particular as an active integrator, as a result of which a value for the phase current or motor current can be determined in a simple manner. Equally conceivable, however, is an integration by means of passive components.

An additional or further aspect of the invention provides that an ohmic resistor is provided, which is connected on one side to an input of the amplifier of the measuring circuit and, on the other, to a pin of the controller. The pin of the controller acts here in particular as a controllable or switchable voltage source. As a result, an adjustable offset value for the level of the voltage change to be measured or detected is realized. In particular, it is thus possible to flexibly raise or lower the (voltage) level, thereby simplifying a reliable and secure detection. As a result, the largest possible measuring range is realized, on the one hand. On the other hand, in particular in connection with an overcurrent cutoff, an adjustment of the triggering threshold thereof is also made possible.

Additionally or alternatively, it is also possible by means of the pin to calibrate the measuring circuit with respect to the influences of temperature and/or aging. In particular, in one embodiment of the measuring circuit with an amplifier connected as an active integrator, the measuring circuit comprises at least one capacitor. Capacitors often have a temperature-dependent capacitance, so that it is important to consider them in the evaluation for determining the motor current. For this purpose, the pin of the controller is activated during an operation time, in which the drive is currentless, and thus the offset is changed. The adjustment speed of the offset is dependent on the capacitance and can thus be evaluated to determine the current capacitance or the temperature-related change in capacitance. Additionally or alternatively, it is conceivable, for example, that the input current is used for calibrating the measuring circuit. If the (average) input current is sufficiently known, then it is possible to determine an error in the motor current and thus the capacitance on the basis of the motor current and the pulse duty factor of the pulse-width modulated drive.

In an embodiment of the measuring circuit with an amplifier connected as an integrator, there is the risk that the amplifier does not detect the inductive voltage change fast enough or is too sensitive to disturbances in the operation of the electric motor drive. In a suitable embodiment, it is therefore provided that the measuring circuit comprises a low-pass filter, which is connected on the input side of the amplifier.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 2 shows three phase windings of a three-phase electric motor of the drive in a star connection;

FIG. 3 shows a bridge module of a bridge circuit of the power converter for controlling a phase winding of the electric motor;

FIG. 4 shows an equivalent circuit diagram of the power source with an intermediate circuit and a shunt resistor.

DETAILED DESCRIPTION

Figure 1:
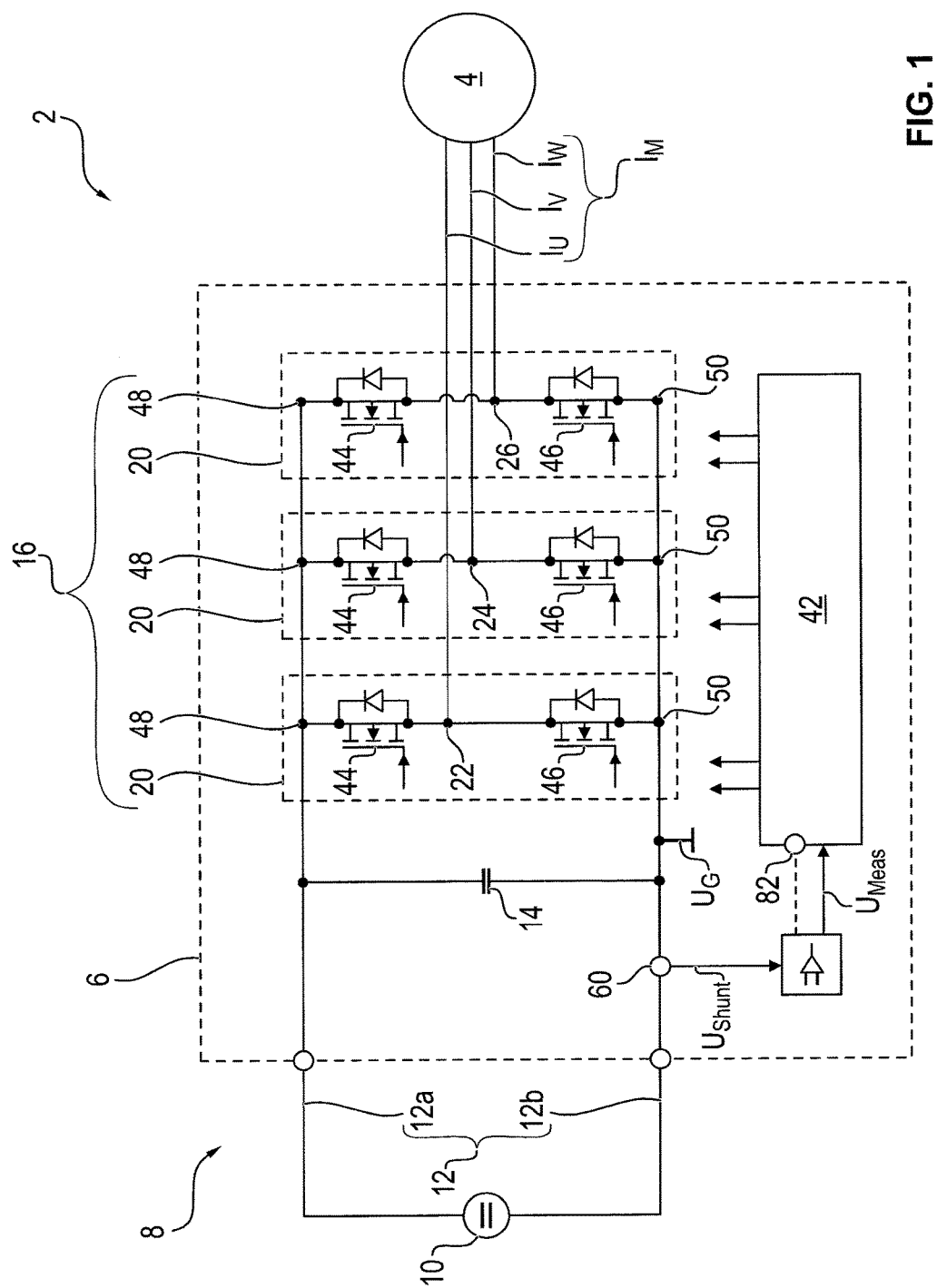
FIG. 1 shows an electric motor drive with a power source and with an electric motor and with a power converter connected therebetween.

FIG. 1 shows an electric or electric motor drive 2 for an electromotive adjustment system of a motor vehicle, for example, for a window lifter or a seat adjuster. Drive 2 comprises as principal components a three-phase electric motor 4, which is connected by means of a converter 6 to a power source (power supply) 8. In this exemplary embodiment, power source 8 comprises an in-vehicle energy storage system 10, for example, in the form of a (motor vehicle) battery, and an associated (direct voltage) intermediate circuit 12, which extends at least partially into power converter 6.

Intermediate circuit 12 is substantially formed by a supply line 12a and a return line 12b, by means of which power converter 6 is connected to energy storage system 10. Lines 12a and 12b are at least partially routed in power converter 6, in which an intermediate circuit capacitor 14 and a bridge circuit 16 are connected between them.

During operation of drive 2, an input or battery current $I_E$, supplied to bridge circuit 16, is converted into a three-phase output current (motor current, three-phase current) $I_U$, $I_V$, $I_W$ for the three phases U, V, W of electric motor 4. The output currents $I_U$, $I_V$, $I_W$, hereinafter also referred to as phase currents, are routed to the corresponding phases (windings) U, V, W (FIG. 2) of a stator. Phase currents $I_U$, $I_V$, $I_W$ are designated together or individually as motor current $I_M$.

A star connection 18 of the three phase windings U, V, W is shown in FIG. 2. The phase windings U, V, and W are each routed with one (phase) end 22, 24, 26 to a respective bridge module 20 (FIG. 3) of bridge circuit 16, and with the respectively opposite end connected to one another at a neutral point 28 as a common connection terminal. In the illustration in FIG. 2, the phase windings U, V, and W are each shown by an equivalent circuit diagram in the form of an inductor 30 and an ohmic resistor 32 and a respective voltage change 34, 36, 38. Voltage 34, 36, 38 in each case dropping across phase winding U, V, W is schematically represented by arrows and results from the sum of the voltage drops across inductor 30 and ohmic resistor 32 and induced voltage 40. Voltage 40 (electromagnetic force, EMF) induced by a movement of a rotor of electric motor 4 is shown by a circle in FIG. 2.

Star connection 18 is controlled by bridge circuit 16. Bridge circuit 16 is designed with bridge modules 20, in particular as a B6 circuit. In this embodiment, the switch is made during operation clocked at each of the phase windings U, V, W at a high switching frequency between a high (direct) voltage level of supply line 12a and a low voltage level of return line 12b. The high voltage level in this case is in particular an intermediate circuit voltage $U_{ZK}$ of intermediate circuit 12, the low voltage level preferably being a ground potential $U_G$. This clocked control is implemented as a PWM control, as shown by arrows in FIG. 1, by a controller 42 with which it is possible to control and/or regulate the rotational speed, power, and the direction of rotation of electric motor 4.

Bridge modules 20 each comprise two semiconductor switches 44 and 46, which are shown in FIG. 2 only schematically and by way of example for phase W. Bridge module 20 is connected on one side with a potential terminal 48 to supply line 12a and thus to intermediate circuit voltage $U_{ZK}$. On the other side, bridge module 20 is contacted with a second potential terminal 50 to return line 12b and thus to ground potential $U_G$. The respective phase end 22, 24, 26 of phase U, V, W can be connected via semiconductor switches 44, 46 either to intermediate circuit voltage $U_{ZK}$ or to ground potential $U_G$. If semiconductor switch 44 is closed (conducting) and semiconductor switch 46 is opened (non-conducting, blocking), phase end 22, 24, 26 is connected to the potential of intermediate circuit voltage $U_{ZK}$. Accordingly, when semiconductor switch 44 is opened and semiconductor switch 46 is closed, phase U, V, W is contacted with the ground potential $U_G$. This makes it possible by means of the PWM control to apply two different voltage levels to each phase winding U, V, W.

A single bridge module 20 is shown in simplified form in FIG. 3. In this exemplary embodiment, semiconductor switches 44 and 46 are realized as MOSFETs (metal-oxide semiconductor field-effect transistor), each switching in a clocked manner by means of the PWM control between a through-connected state and a blocking state. For this purpose, the respective gate terminals are routed to corresponding control voltage inputs 52, 54, by means of which the signals of the PWM control of controller 42 are transmitted.

FIG. 4 shows an equivalent circuit diagram for power source 8. During operation, energy storage system 10 generates a battery voltage $U_{Bat}$ as well as the corresponding battery current $I_E$ for operating power converter 6. FIG. 4 shows the internal resistance of energy storage system 10 as an ohmic resistor 56 and a self-inductance of energy storage system 10 as an inductor 58. In return line 12b, a shunt resistor (measuring resistor) at which the intermediate circuit voltage $U_{ZK}$ drops is connected to a measuring point 60.

The shunt resistor is shown in an equivalent circuit diagram as an ohmic resistor 62 and as an inductor 64. During operation, an intermediate circuit current $I_{ZK}$ of the intermediate circuit flows through the shunt resistor and generates a voltage change $U_{Shunt}$ which is composed of an ohmic voltage change 66 at resistor 62 and an inductive voltage change 68 at inductor 64. The operating situation in particular during a switching operation of semiconductor switches 44, 46 is considered below, in which inductive voltage change 68 has a substantially larger voltage value than ohmic voltage change 66, and thus voltage change $U_{Shunt}$ is substantially equal to voltage change 68.

In an alternative embodiment, measuring point 60 has no shunt resistor, for example, and is designed in particular without a measuring resistor, so that the tapped voltage change $U_{Shunt}$ is generated substantially only due to a contacted trace section of return line 12b.

To determine motor current $I_M$, voltage change $U_{Shunt}$ is monitored by controller 42 by means of a measuring circuit 70. Different exemplary embodiments of measuring circuit 70 will be explained below with reference to FIGS. 5 to 8.

Figure 5:
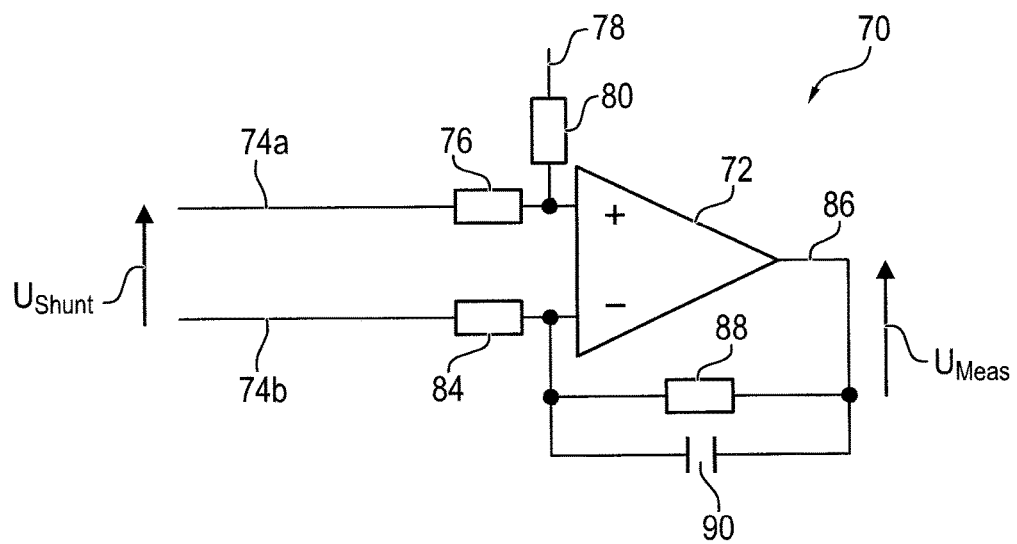
FIGS. 5 to 8 show a measuring circuit for detecting the voltage dropping across the shunt resistor.

Measuring circuit 70 shown in detail in FIG. 5 comprises an amplifier 72 connected as an active integrator. Amplifier 72 in this exemplary embodiment is designed in particular as an operational amplifier. Amplifier 72 is contacted by means of two input-side measuring lines 74a, 74b to the shunt resistor or measuring point 60, such that the voltage change $U_{Shunt}$ is applied on the input side.

Measuring line 74a is routed to the positive input of amplifier 72 and has an ohmic resistor 76 as an offset resistor. An offset line 78 is connected to a resistor 80 as a second offset resistor between resistor 76 and the input of amplifier 72. Offset line 78 is routed to a pin 82 of controller 42, which acts as a switchable voltage source for setting an offset voltage level. An ohmic resistor 84 is connected in measuring line 74b connected to the negative input of amplifier 72. The output of amplifier 72 has a negative feedback 86 which is contacted between resistor 84 and the negative input of amplifier 72 to measuring line 74b. Negative feedback 86 comprises an ohmic resistor 88 to which a capacitor or a capacitance 90 is connected in parallel.

Resistor 84 and capacitors 90 hereby establish the integration factor of the active integrator. A voltage level is generated by resistors 76 and 80 as an offset for the input-side voltage change $U_{shunt}$. Resistors 76 and 80 also act as a voltage divider, this influence being preferably taken into account in the dimensioning of resistor 84 and capacitor 90. Resistor 88 acts as a discharge resistor, thus preventing amplifier 72 from running into a limit. The voltage change $U_{Shunt}$ is integrated or amplified by measuring circuit 70 to form a measuring voltage $U_{Meas}$, which is sent to controller 42 for evaluation. Preferably, the time constant resulting from the product of the resistance value of resistor 84 and the capacitance value of capacitor 90 is sized sufficiently large to limit or completely prevent negative effects on the measurement.

The value of the measuring voltage $U_{Meas}$ is detected by controller 42. Depending on the pulse width modulated control of semiconductor switches 44, 46 and the measuring voltage $U_{Meas}$, controller 42 hereby determines a value for the motor current $I_M$, generated by the power converter 6. In particular, controller 42 forms the difference of the measurement voltage $U_{Meas}$ before and after a switching process of semiconductor switches 44, 46, the difference being proportional to the generated phase current $I_U$, $I_V$, $I_W$ or the motor current $I_M$.

Figure 6:
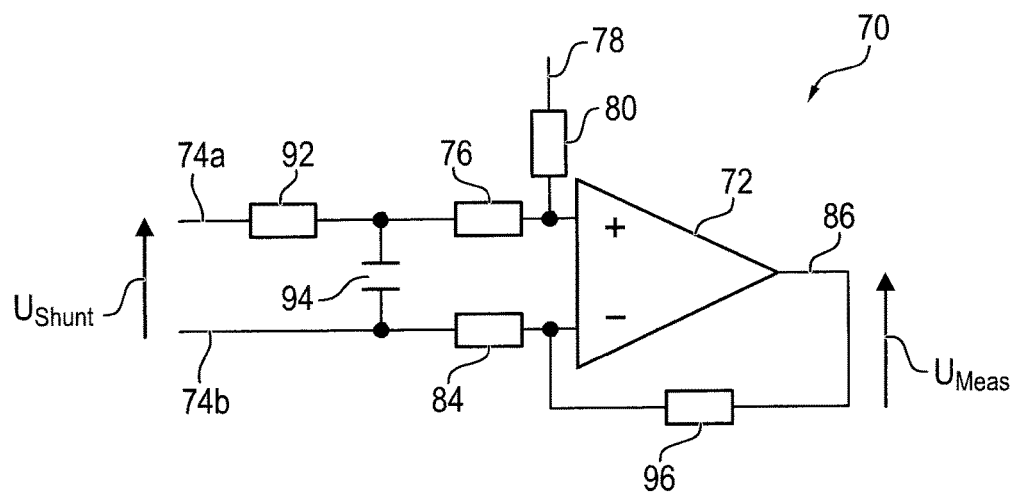

Measuring circuit 70 of FIG. 6 shows an exemplary embodiment in which the integration of the voltage change $U_{Shunt}$ to form the measuring voltage $U_{Meas}$ occurs only by means of passive components.

In the exemplary embodiment of FIG. 6, measuring line 74a has an ohmic resistor 92 connected upstream of resistor 76. Resistor 92 acts as a discharge resistor for a capacitor 94 connected between measuring lines 74a and 74b. The resistance value of resistor 92 and the capacitance value of capacitor 94 in this case are preferably dimensioned such that the corresponding time constant is sufficiently long in order to limit or completely prevent negative effects on the measurement. Negative feedback 86 has only one ohmic resistor 96. The amplification factor of amplifier 72 in this case depends on the resistance values of resistors 84 and 96.

The exemplary embodiment shown in FIG. 6 corresponds approximately to a conventional compensation circuit, the essential difference being the dimensioning of the components. In a conventional compensation, the time constant derived from resistor 92 and capacitor 94 is as equal as possible to the time constant of the measuring point, which results from the ratio of the inductance value to the ohmic resistance of the measuring point. In the exemplary embodiment, however, the time constant is preferably substantially greater; for example, the time constant of measuring circuit 70 is greater than that of measuring point 60 by a factor of 1000.

Figure 7:
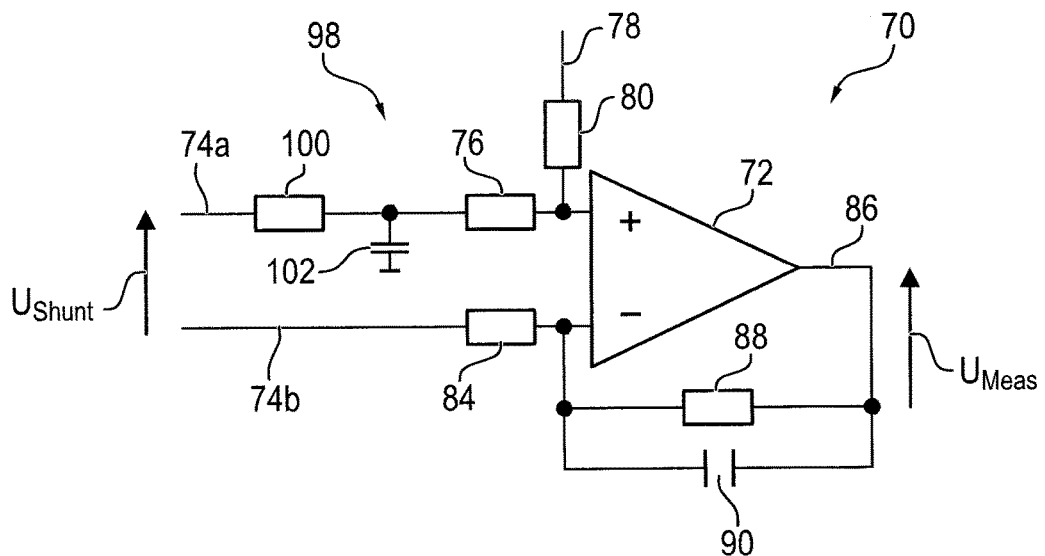

The exemplary embodiment in FIG. 7 shows a measuring circuit 70 according to FIG. 5 with an additional filter circuit 98, which is connected in measuring line 74a. Filter circuit 98 is made as a low-pass filter with an ohmic resistor 100 as a filter resistor and a capacitor 102 connected to ground.

Figure 8:
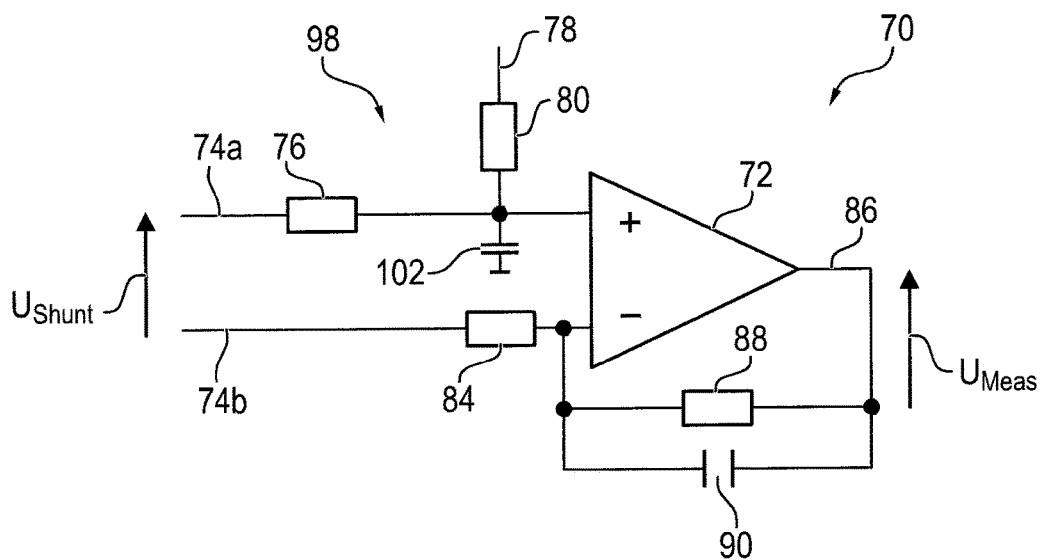

In the exemplary embodiment in FIG. 8, an alternative embodiment of filter circuit 98 is shown. In this exemplary embodiment, the (offset) resistor 76 is connected as a filter resistor before capacitor 102. As a result, a particularly component-reduced filter circuit 98 or measuring circuit 70 is realized.

The invention is not limited to the exemplary embodiments described above. Rather, other variants of the invention can also be derived herefrom by the skilled artisan, without going beyond the subject of the invention. Particularly, further all individual features described in relation to the exemplary embodiments can also be combined with one another in a different manner, without going beyond the subject of the invention.

What is claimed is:

1. A method for determining a motor current of an electric motor drive with a power source and with an electric motor and with a power converter connected therebetween, the method comprising:
    converting wherein an input current of the power source via a pulse width modulated control of a number of semiconductor switches of the power converter into the motor current;
    influencing an intermediate circuit current of an intermediate circuit of the power source during the pulse width modulated control of the number of semiconductor switches;
    detecting an inductive voltage change, while neglecting an ohmic voltage change, at a measuring point of the intermediate circuit due to an inductive influence on the intermediate circuit current; and
    determining a value for a generated motor current based on the pulse width modulated control of the number of semiconductor switches and the inductive voltage change detected at the measuring point.

2. The method according to claim 1, wherein the inductive voltage change detected at the measuring point is amplified.

3. The method according to claim 1, wherein the inductive voltage change is integrated at the measuring point.

4. The method according to claim 1, wherein the input current is detected to determine the motor current.

5. The electric motor drive for the motor vehicle, comprising:
the power source;
the electric motor;
the power converter connected between the power source and the electric motor; and
a controller for carrying out the method according to claim 1.

6. The electric motor drive according to claim 5, wherein the measuring point at which the inductive voltage change is detected is designed as a measuring resistor-free trace section of the intermediate circuit.

7. The electric motor drive according to claim 5, wherein the controller detects the inductive voltage change at the measuring point via a measuring circuit with an amplifier.

8. The electric motor drive according to claim 7, wherein the amplifier of the measuring circuit is connected as an active integrator.

9. The electric motor drive according to claim 7, wherein an ohmic resistor is provided which is connected on one side to an input of the amplifier of the measuring circuit and, on the other side, to a pin of the controller.

10. The electric motor drive according to claim 9, wherein the pin of the controller is a controllable voltage source.

11. The electric motor drive according to claim 7, wherein the measuring circuit comprises a low-pass filter, which is connected on an input side of the amplifier.

12. The electric motor drive according to claim 7, further comprising:
a capacitor connected between an input of the amplifier and an output of the amplifier.

13. The electric motor drive according claim 7, further comprising:
a resistor connected between an input of the amplifier and an output of the amplifier.

14. The electric motor drive according to claim 7, further comprising:
a first resistor connected to a first input of the amplifier and a second resistor connected to a second input of the amplifier.

15. The electric motor drive according to claim 5, wherein the measuring circuit has a time constant greater than of the measuring point by a factor of 1000.

16. An electric motor drive for a motor vehicle, comprising:
a power source;
an electric motor; and
a power converter connected between the power source and the electric motor, the power converter comprising:
semiconductor switches configured to convert an input current into a motor current;
an intermediate circuit connected between the semiconductor switches and the power source; and
a measuring circuit coupled to the intermediate circuit, the measuring circuit being configured to measure an inductive voltage change at a measuring point of the intermediate circuit,
wherein the measuring circuit determines a value for the motor current by evaluating a switching state of the semiconductor switches with the inductive voltage change, while neglecting an ohmic voltage change.

* * * * *